(12) United States Patent
Lee et al.

(10) Patent No.: US 11,359,970 B2
(45) Date of Patent: Jun. 14, 2022

(54) MICROELECTROMECHANICAL INFRARED SENSING APPARATUS HAVING STOPPERS

(71) Applicant: Industrial Technology Research Institute, Hsin-Chu (TW)

(72) Inventors: Bor-Shiun Lee, New Taipei (TW); Ming-Fa Chen, Taoyuan (TW); Ying-Che Lo, Tainan (TW); Chao-Ta Huang, Hsinchu (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 16/904,820

(22) Filed: Jun. 18, 2020

(65) Prior Publication Data

US 2021/0190595 A1    Jun. 24, 2021

(30) Foreign Application Priority Data

Dec. 24, 2019   (TW) .................................. 108147466

(51) Int. Cl.
*G01J 5/02*     (2022.01)
*G01J 5/20*     (2006.01)
*H01L 31/09*    (2006.01)

(52) U.S. Cl.
CPC .......... *G01J 5/0275* (2013.01); *G01J 5/0205* (2013.01); *G01J 5/0215* (2013.01); *G01J 5/20* (2013.01); *H01L 31/09* (2013.01)

(58) Field of Classification Search
None
See application file for complete search history.

(56) References Cited

U.S. PATENT DOCUMENTS

| 5,656,816 A | 8/1997 | Tanaka |
| 6,316,770 B1 | 11/2001 | Ouvrier-Buffet et al. |

(Continued)

FOREIGN PATENT DOCUMENTS

| CN | 1340153 | 3/2002 |
| JP | H08201177 A | 8/1996 |

(Continued)

OTHER PUBLICATIONS

V. Yu. Zerov et al., "Calculational modeling of the main characteristics of an uncooled linear microbolometer array", Mar. 2004, pp. 153-157, The Optical Society of America.

(Continued)

*Primary Examiner* — Edwin C Gunberg
(74) *Attorney, Agent, or Firm* — WPAT, PC

(57) ABSTRACT

A microelectromechanical infrared sensing apparatus includes a substrate, a sensing plate, a plurality of supporting elements and a plurality of stoppers. The substrate includes an infrared reflecting layer. The sensing plate includes an infrared absorbing layer. The supporting elements are disposed on the substrate, and each of the supporting elements is connected to the sensing plate, such that the sensing plate is suspended above the infrared reflecting layer. The stoppers are disposed between the substrate and the sensing plate. When the sensing plate moves toward the infrared reflecting layer and the stoppers contact both the substrate and the sensing plate, the distance between the sensing plate and the infrared reflecting layer is substantially equal to the height of at least one of the stoppers.

32 Claims, 20 Drawing Sheets

(56) References Cited

U.S. PATENT DOCUMENTS

| | | |
|---|---|---|
| 7,750,301 B1 | 7/2010 | Woolaway et al. |
| 7,968,846 B2 | 6/2011 | Talghader et al. |
| 8,373,123 B2 | 2/2013 | Ouvrier-Buffet |
| 9,417,134 B2 | 8/2016 | Koechlin et al. |
| 10,179,728 B2 | 1/2019 | Graybeal |
| 10,203,252 B2 | 2/2019 | Hsu et al. |
| 10,529,876 B2 | 1/2020 | Hsu et al. |
| 2003/0102432 A1 | 6/2003 | Boieriu et al. |
| 2005/0017177 A1 | 1/2005 | Tai et al. |
| 2013/0161515 A1 | 6/2013 | Park et al. |
| 2014/0091217 A1* | 4/2014 | Oulachgar .............. G01J 5/024 250/338.3 |
| 2014/0246749 A1 | 9/2014 | Nam et al. |
| 2016/0097681 A1 | 4/2016 | Buchan et al. |

FOREIGN PATENT DOCUMENTS

| | | |
|---|---|---|
| KR | 20180032888 A | 4/2018 |
| TW | 561249 | 11/2003 |
| TW | I532980 | 5/2016 |

OTHER PUBLICATIONS

Frank Niklaus et al., "Performance model for uncooled infrared bolometer arrays and performance predictions of bolometers operating at atmospheric pressure", Infrared Physics & Technology 51 (2008), pp. 168-177, 2007 Elsevier B.V. All rights reserved.
Paul W. Kruse, "Resistive Bolometers", Jan. 1, 2001, pp. 33-48, https://www.spiedigitallibrary.org/ebooks/.
TW OA dated Nov. 4, 2020.
CN OA dated Nov. 29, 2021.

\* cited by examiner

MICROELECTROMECHANICAL INFRARED SENSING APPARATUS HAVING STOPPERS

CROSS REFERENCE TO RELATED APPLICATION

All related applications are incorporated by reference. The present application is based on, and claims priority from, Taiwan Application Serial Number 108147466, filed on Dec. 24, 2019, the disclosure of which is hereby incorporated by reference herein in its entirety.

TECHNICAL FIELD

The technical field relates to a microelectromechanical infrared sensing apparatus.

BACKGROUND

In recent years, microelectromechanical infrared sensing apparatuses have been widely and successfully applied to various fields such as industrial production, environment monitoring, home health care and temperature measurement. It can be foreseen that demands of the microelectromechanical infrared sensing apparatuses would increase in the future. For possible future needs, a modification for the microelectromechanical infrared sensing apparatus to be more workable and able to work automatically under different environmental temperatures is definitely welcome to the art.

In addition, since a distance between an infrared absorbing layer and an infrared reflecting layer in a typical microelectromechanical infrared sensing apparatus is fixed, a high-resolution readout circuit is easy to be saturated while being applied to read signals from the microelectromechanical infrared sensing apparatus. Accordingly, a limitation upon the sensing range of the microelectromechanical infrared sensing apparatus is thus inevitable.

Besides, since the infrared absorbing layer of the microelectromechanical infrared sensing apparatus is sensitive to surrounding temperature, from which keen thermal stress variation and corresponding thermal strain (mainly in bending) would be expected. Accordingly, the distance between the infrared absorbing layer and the infrared reflecting layer may not be consistent, which significantly effects the sensing performance of the microelectromechanical infrared sensing apparatus.

SUMMARY

An embodiment of the disclosure relates to a microelectromechanical infrared sensing apparatus, which includes a substrate, a sensing plate, a plurality of supporting elements and a plurality of stoppers. The substrate includes an infrared reflecting layer. The sensing plate includes an infrared absorbing layer. The supporting elements are disposed on the substrate. Each of the supporting elements is connected to the sensing plate, such that the sensing plate is suspended above the infrared reflecting layer. The stoppers are disposed between the substrate and the sensing plate. When the sensing plate moves toward the infrared reflecting layer and the stoppers contact both the substrate and the sensing plate, the distance between the sensing plate and the infrared reflecting layer is substantially equal to the height of at least one of the stoppers.

Another embodiment of the disclosure relates to a microelectromechanical infrared sensing apparatus, which includes a substrate, a sensing plate, a plurality of supporting elements and a plurality of stoppers. The substrate includes an infrared reflecting layer. The sensing plate includes an infrared sensing layer, a conducting layer and an infrared absorbing layer; the infrared absorbing layer of the sensing plate is disposed between the infrared sensing layer of the sensing plate and the conducting layer of the sensing plate. The supporting elements are disposed on the substrate. Each of the supporting elements is connected to the sensing plate, such that the sensing plate is suspended above the infrared reflecting layer. When the sensing plate moves toward the infrared reflecting layer and the stoppers contact both the substrate and the sensing plate, the distance between the sensing plate and the infrared reflecting layer is substantially equal to the height of at least one of the stoppers.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

DETAILED DESCRIPTION

Figure 1:
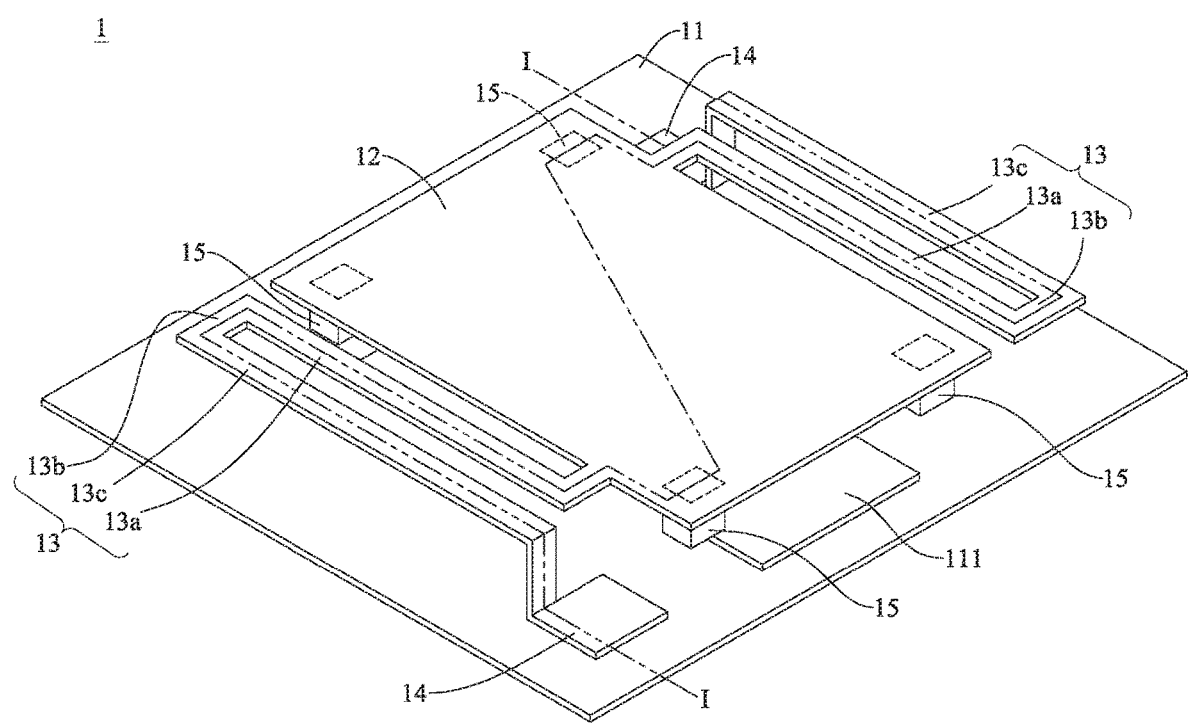
FIG. 1 is a perspective view of a microelectromechanical infrared sensing apparatus in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Figure 2:
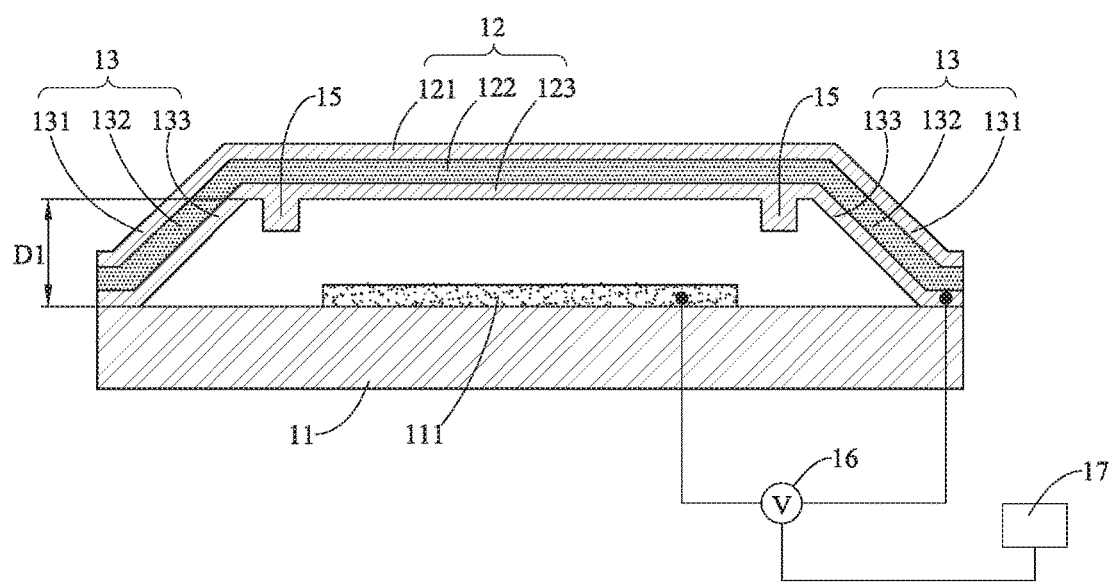
FIG. 2 and FIG. 3 are cross-sectional views of the microelectromechanical infrared sensing apparatus in accordance with one embodiment of the disclosure.
Figure 3:
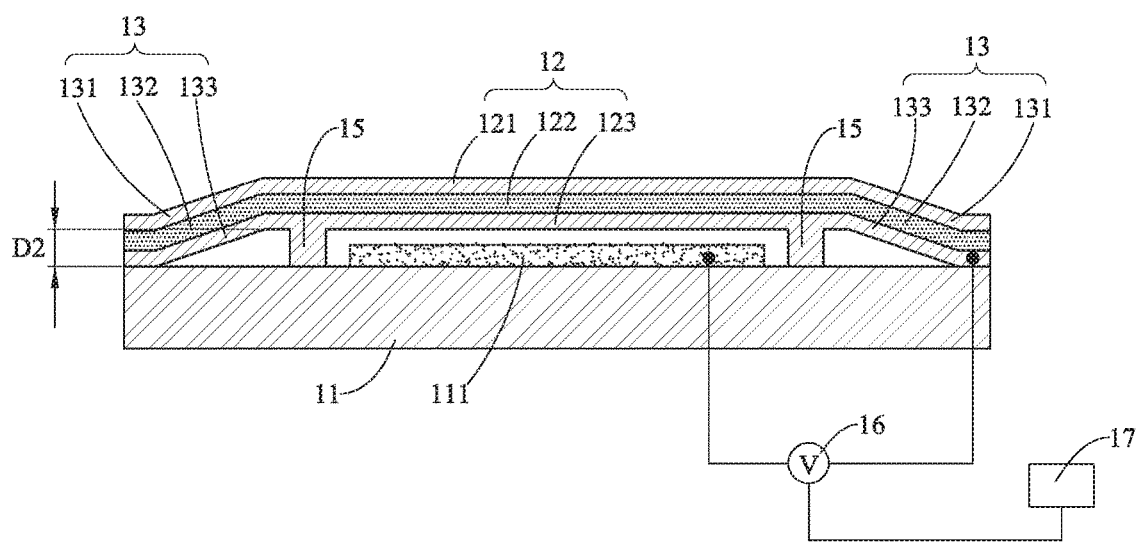

Please refer to FIG. 1, FIG. 2 and FIG. 3, which are perspective and cross-sectional views of a microelectromechanical infrared sensing apparatus 1 in accordance with one embodiment of the disclosure, respectively. As shown in FIG. 1 and FIG. 2, the microelectromechanical infrared sensing apparatus 1 includes a substrate 11, a sensing plate 12, a plurality of supporting elements 13 and a plurality of anchors 14, a plurality of stoppers 15, a voltage source 16 and a controller 17.

The substrate 11 includes thereon an infrared reflecting layer 111.

The anchors 14 are disposed on the substrate 11. One end of each of the supporting elements 13 is connected to the sensing plate 12, while the other end thereof is connected to the corresponding anchor 14. Thus, the sensing plate 12 can be suspended above the infrared reflecting layer 111. Thereupon, one surface of the sensing plate 12 can absorb the radiant energy of the incoming infrared light, while another surface thereof can absorb the other infrared light reflected back by the infrared reflecting layer 111. Besides, each of the supporting elements 13, as a continuous extending element, includes orderly a connecting portion 13a, a bending portion 13b and a supporting portion 13c. The connecting portion 13a is connected to the sensing plate 12, and the supporting portion 13c is connected to the anchor 14.

The stoppers 15 are disposed on the sensing plate 12, and between the substrate 11 and the sensing plate 12. In the embodiment, the line segments connecting each of the two adjacent the stoppers 15 can form a rectangle, which is a central symmetrical polygon. In another embodiment, the line segments connecting each of the two adjacent the stoppers 15 can form a rhombus, a circle or other central symmetrical polygons. In another embodiment, the line segments connecting each of the two adjacent the stoppers 15 can form a triangle, a pentagon, a hexagon, other axial symmetrical polygons or irregular shapes. In the embodiment, the stoppers 15 have the same height. In another embodiment, the stoppers 15 may have different heights.

The voltage source 16 is electrically connected to the infrared reflecting layer 111 and the sensing plate 12. More specifically, the material of infrared reflecting layer 111 is a metal, such as Al, Au, Ag, W, Cu, Ti, Ta, Mo, etc. The controller 17 is electrically connected to the voltage source 16 to control the voltage source 16 so as to adjust the voltage difference between the infrared reflecting layer 111 and the sensing plate 12. In one embodiment, the controller 17 may be a microcontroller unit (MCU), a central processing unit (CPU), an application-specific integrated circuit (ASIC) or other similar devices.

FIG. 2 is the cross-sectional view of the microelectromechanical infrared sensing apparatus 1 along the section line I-I in FIG. 1. As shown, the sensing plate 12 includes an infrared sensing layer 121, a conducting layer 123 and an infrared absorbing layer 122. The infrared absorbing layer 122 is disposed between the infrared sensing layer 121 and the conducting layer 123. In this embodiment, the sensing plate 12 has a symmetrical structure. In details, the material of the conducting layer 123 can be the same as the material of the infrared sensing layer 121, and the thickness of the conducting layer 123 can be substantially equal to the thickness of the infrared sensing layer 121. Besides, the conducting layer 123 and the infrared sensing layer 121 may be alloy layers, metal compound layers, metal-oxide layers, silicon compound layers and silicon layers, such as SiGe, $VO_x$, p-Si, a-Si, Ti-silicide, etc. Further, the infrared absorbing layer 122 is a dielectric material layer, such as $SiN_x$, $SiO_x$, $SiO_xN_y$, etc. As described above, the conducting layer 123 and the infrared sensing layer 121 can be made of the same material, and the thickness of the conducting layer 123 can be substantially equal to the thickness of the infrared sensing layer 121. Therefore, the conducting layer 123 and the infrared sensing layer 121 can have the same material properties, the same structure and the same dimensions. The aforementioned material properties may be coefficient of thermal expansion (C.T.E.) or Young's Modulus (E). Accordingly, the symmetric sensing plate 12 can have low thermal stress and low warpage during a manufacturing process of the sensing plate 12. Thus, without conducting a lot of experiments to obtain the optimal thickness of the conducting layer 123 and optimal thickness of the infrared sensing layer 121 while in manufacturing the above sensing plate 12, since the material of the conducting layer 123 is the same as that of the infrared sensing layer 121, and the thickness of the conducting layer 123 is substantially equal to that of the infrared sensing layer 121, thus the warpage and the thermal stress of the sensing plate 12 can still be significantly reduced. For the same reason, when the material of the conducting layer 123 is the same as that of the infrared sensing layer 121 and the thickness of the conducting layer 123 is substantially equal to that of the infrared sensing layer 121, the manufacturing cost of the sensing plate 12 can be obviously decreased. In another embodiment, the sensing plate 12 may have an unsymmetrical structure.

Similarly, each of the supporting elements 13 can also include an infrared sensing layer 131, a conducting layer 133 and an infrared absorbing layer 132. The infrared absorbing layer 132 is disposed between the infrared sensing layer 131 and the conducting layer 133. The infrared absorbing layer 132 of each of the supporting elements 13 is connected to the infrared absorbing layer 122 of the sensing plate 12. The infrared sensing layer 131 of each of the supporting elements 13 is connected to the infrared sensing layer 121 of the sensing plate 12. The conducting layer 133 of each of the supporting elements 13 is connected to the conducting layer 123 of the sensing plate 12. Each of the supporting elements 13 can also have a symmetrical structure. In other words, the material of the conducting layer 133 of each of the supporting elements 13 can be the same as that of the infrared sensing layer 131 thereof, and the thickness of the conducting layer 133 thereof can be substantially equal to that of the infrared sensing layer 131 thereof. Therefore, the supporting elements 13 have low warpage and low thermal stress after the manufacturing process. With the conducting layer 133 and the infrared sensing layer 131 of each of the supporting elements 13 to be made of the same material, and the thickness of the conducting layer 133 thereof to be substantially equal to that of the infrared sensing layer 131 thereof, thus the supporting elements 13 and the sensing plate 12 can be manufactured by the same manufacturing process. Accordingly, the complexity of the manufacturing process and the manufacturing cost of the microelectromechanical infrared sensing apparatus 1 can be reduced.

Since the infrared sensing layer 121 can change the resistance after absorbing the radiant energy of the incoming infrared light, and the voltage difference between the infrared reflecting layer 111 and the sensing plate 12 may change the electrostatic force between the conducting layer 123 and the infrared reflecting layer 111, thus the sensing plate 12 can move toward or away from the infrared reflecting layer 111 due to the changes in resistance and voltage difference, and so the distance between the infrared reflecting layer 111 and the sensing plate 12 is changed. Such a mechanism can vary the absorbing rate of the infrared sensing layer 121 so as to avoid possible saturation in the readout circuit. Thereupon, the sensing range of the microelectromechanical infrared sensing apparatus 1 can be effectively expanded.

As shown in FIG. 2, the temperature (hereinafter "target temperature") of the sensing target detected by the microelectromechanical infrared sensing apparatus 1 is T1, the controller 17 does not turn on the voltage source 16, the distance between the sensing plate 12 and the infrared reflecting layer 111 is D1, and the microelectromechanical infrared sensing apparatus 1 operates in a first absorbing rate mode (i.e. the mode of high absorbing rate).

As shown in FIG. 3, when the target temperature is T2 (T2 is greater than T1), the controller 17 turns on the voltage source 16 to generate a first control voltage V1 so as to control the sensing plate 12 to move toward the infrared reflecting layer 111. When the stoppers 15 contacts the substrate 11, the sensing plate 12 stops moving. At the moment, the distance D2 between the sensing plate 12 and the infrared reflecting layer 111 is substantially equal to the height of the stoppers 15. When the stoppers 15 contact the substrate 11, and the distance between the sensing plate 12 and the infrared reflecting layer 111 is D2; the microelectromechanical infrared sensing apparatus 1 operates in a second absorbing rate mode (i.e. the mode of low absorbing rate). Upon such an arrangement, possible saturation of the readout circuit can be avoided, and so the microelectromechanical infrared sensing apparatus 1 can correctly operate and the sensing range thereof can be increased.

In addition, the stiffness of the supporting elements 13 in a direction of a normal vector of the substrate 11 is less than the stiffness of the sensing plate 12 in the same direction. Thus, when the controller 17 turns on the voltage source 16, the sensing plate 12 can more easily move toward the substrate 11. Accordingly, the voltage difference, applied by the voltage source 16, between the infrared reflecting layer 111 and the sensing plate 12 can be low. On the other hand, also since the stiffness of the supporting elements 13 in the direction of the normal vector of the substrate 11 is less than that of the sensing plate 12 in the same direction, the sensing plate 12 will not bend too much to be close to the substrate 11. Thereupon, the resistance of the infrared sensing layer 121 can keep unchanged when the sensing plate 12 moves toward the substrate 11.

When the target temperature is T1, the controller 17 turns off the voltage source 16 so as to have the sensing plate 12 to move in the direction away from the infrared inflecting layer 111 to return back to the initial position, as shown in FIG. 2. At the moment, the distance between the sensing plate 12 and the infrared reflecting layer 111 is returned to D1 again and the microelectromechanical infrared sensing apparatus 1 operates in the first absorbing rate mode (i.e. the mode of high absorbing rate).

Figure 4:
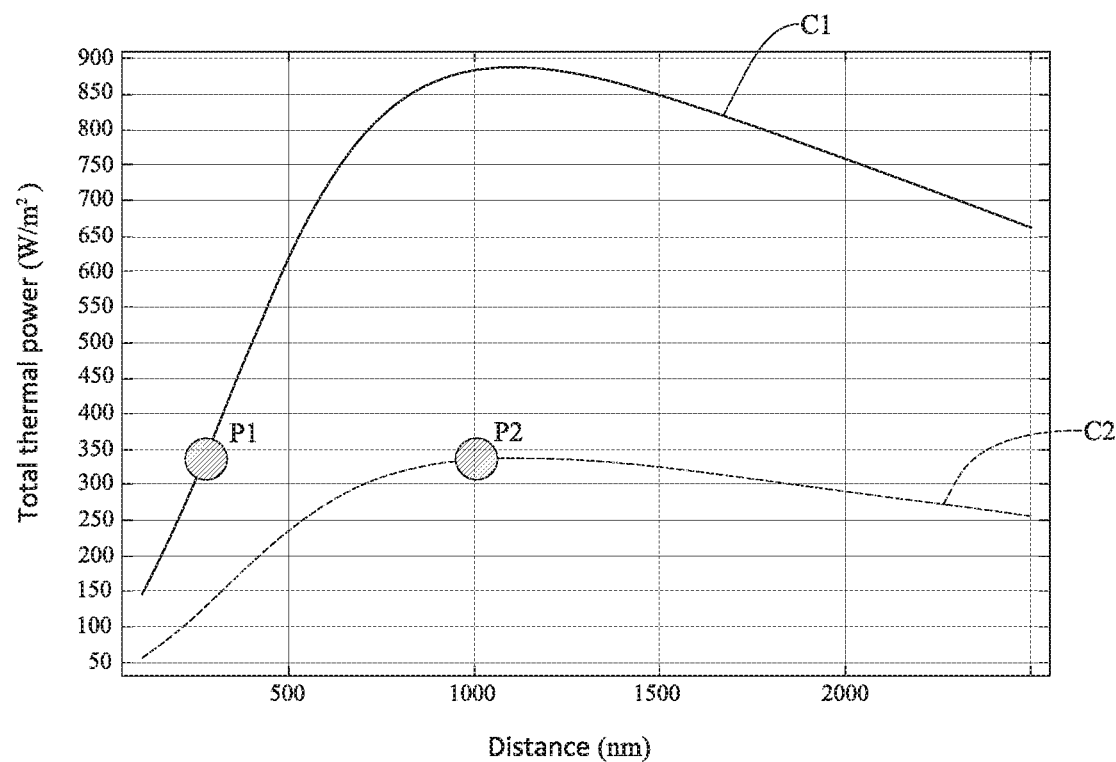
FIG. 4 and FIG. 5 are simulation diagrams of the microelectromechanical infrared sensing apparatus in accordance with one embodiment of the disclosure.
Figure 5:
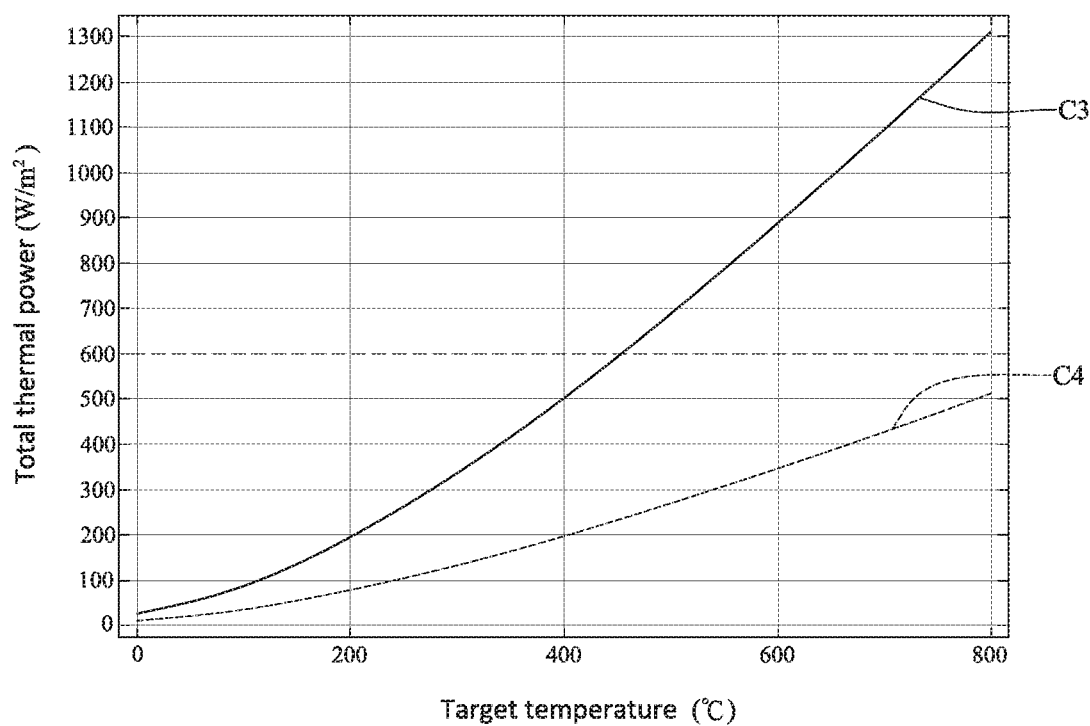

Please refer to FIG. 4 and FIG. 5, which are diagrams of the simulation results of the microelectromechanical infrared sensing apparatus 1 in accordance with one embodiment of the disclosure. As shown in FIG. 4, the curve C1 shows the relation between the total thermal power absorbed by the microelectromechanical infrared sensing apparatus 1 and the distance between the sensing plate 12 and the infrared reflecting layer 111 of the substrate 11 when the target temperature is 600° C. The curve C2 shows the relation between the total thermal power absorbed by the microelectromechanical infrared sensing apparatus 1 and the distance between the sensing plate 12 and the infrared reflecting layer 111 of the substrate 11 when the target temperature is 300° C. Therefore, the microelectromechanical infrared sensing apparatus 1 can have several operating points P1 and P2. More specifically, when the temperature of the sensing target is 600° C., the microelectromechanical infrared sensing apparatus 1 can operate at the operating point P1. In this case, the microelectromechanical infrared sensing apparatus 1 can adjust the distance between the sensing plate 12 and the infrared reflecting layer 111 to be about 250 nm. In this way, the total thermal power absorbed by the microelectromechanical infrared sensing apparatus 1 can be less than a predetermined value, such as 600 W/m$^2$, in order to avoid the saturation of the high-resolution readout circuit. When the temperature of the sensing target is 300° C., the microelectromechanical infrared sensing apparatus 1 can operate at the operating point P2. In this case, the microelectromechanical infrared sensing apparatus 1 can adjust the distance between the sensing plate 12 and the infrared reflecting layer 111 to be about 1000 nm. In this way, the total thermal power absorbed by the microelectromechanical infrared sensing apparatus 1 can be less than the above predetermined value (600 W/m$^2$) to prevent the high-resolution readout circuit from being saturated.

As shown in FIG. 5, the curve C3 shows the relation between the total thermal power absorbed by the microelectromechanical infrared sensing apparatus 1 and the target temperature when the distance between the sensing plate 12 and the infrared reflecting layer 111 is 1000 nm. The curve C4 shows the relation between the total thermal power absorbed by the microelectromechanical infrared sensing apparatus 1 and the target temperature when the distance between the sensing plate 12 and the infrared reflecting layer 111 is 250 nm. According to FIG. 5, while in sensing different target temperatures (for example, within a target temperature range between 0° C. and 400° C.), the microelectromechanical infrared sensing apparatus 1 can adjust the distance between the sensing plate 12 and the infrared reflecting layer 111 to be in the range between 250 nm-1000 nm. In this way, the total thermal power absorbed by the microelectromechanical infrared sensing apparatus 1 can be less than a predetermined value, such as 600 W/m$^2$. Thus, the microelectromechanical infrared sensing apparatus 1 can not only increase the sensing range of the target temperature, but also can prevent the readout circuit from being saturated.

As described above, the microelectromechanical infrared sensing apparatus 1 of the embodiment has the stoppers 15.

Besides, the distance between the sensing plate 12 and the infrared reflecting layer 111 of the microelectromechanical infrared sensing apparatus 1 can be adjusted via the voltage source 16 and the stoppers 15. Thus, the microelectromechanical infrared sensing apparatus 1 can effectively prevent the readout circuit from being saturated in different environmental temperatures. Accordingly, the microelectromechanical infrared sensing apparatus 1 can have several operating points, and can effectively expand the sensing range thereof.

In addition, the symmetrical structuring of the microelectromechanical infrared sensing apparatus 1 can reduce overall thermal stress and warpage so as to further avoid warping upon the sensing plate 12 due to the temperature change during the manufacturing process or the operational environment. If the warpage of the sensing plate 12 is excessive, the distance between the sensing plate 12 and the infrared reflecting layer 111 cannot be treated as a constant. That is to say, when the structure of the sensing plate 12 of the microelectromechanical infrared sensing apparatus 1 is not symmetrical, the distance between a portion of the sensing plate 12 and the infrared reflecting layer 111 may be inconsistent with the distance between the other portion of the sensing plate 12 and the infrared reflecting layer 111. It is obvious that the asymmetry leading to inconsistent spacing between the sensing plate 12 and the infrared reflecting layer 111 should be avoided for the sake of controllability. In this embodiment, the symmetrical structure of the sensing plate 12 can assist the controller 17 to accurately and properly adjust the distance between the sensing plate 12 and the infrared reflecting layer 111, such that the sensing performance of the microelectromechanical infrared sensing apparatus 1 can be optimized.

Figure 6:
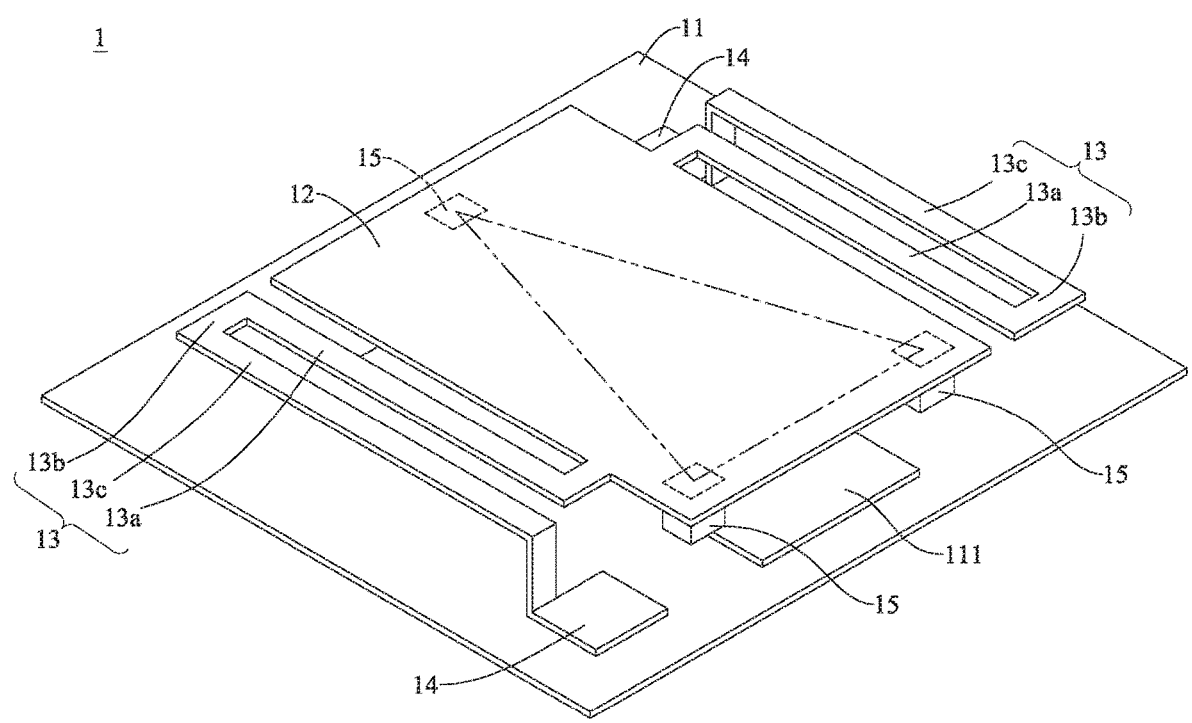
FIG. 6 is a perspective view of a microelectromechanical infrared sensing apparatus in accordance with one embodiment of the disclosure.

Please refer to FIG. 6, which is a perspective view of a microelectromechanical infrared sensing apparatus 1 in accordance with one embodiment of the disclosure. As shown in FIG. 6, the stoppers 15 of the embodiment are disposed on the sensing plate 12 and the line segments connecting each of the two adjacent the stoppers 15 can form a triangle.

Figure 7:
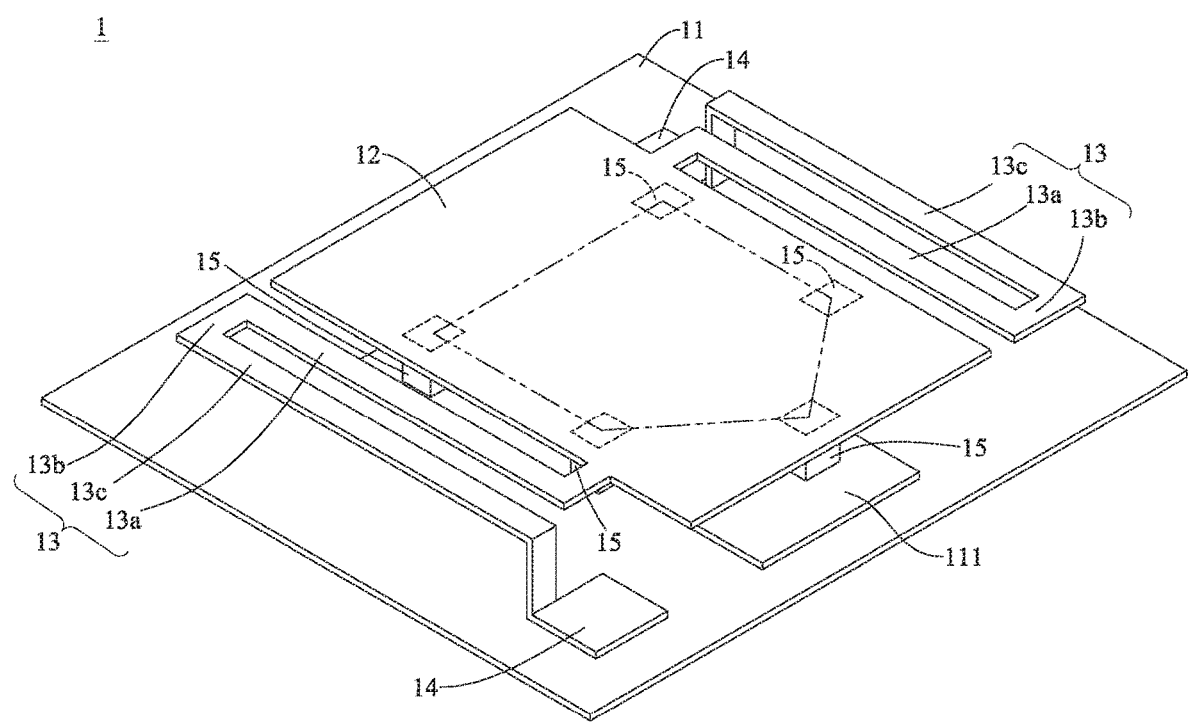
FIG. 7 is a perspective view of a microelectromechanical infrared sensing apparatus in accordance with one embodiment of the disclosure.

Please refer to FIG. 7, which is a perspective view of a microelectromechanical infrared sensing apparatus 1 in accordance with one embodiment of the disclosure. As shown in FIG. 7, the stoppers 15 of the embodiment are disposed on the sensing plate 12 and the line segments connecting each of the two adjacent the stoppers 15 can form a pentagon.

Figure 8:
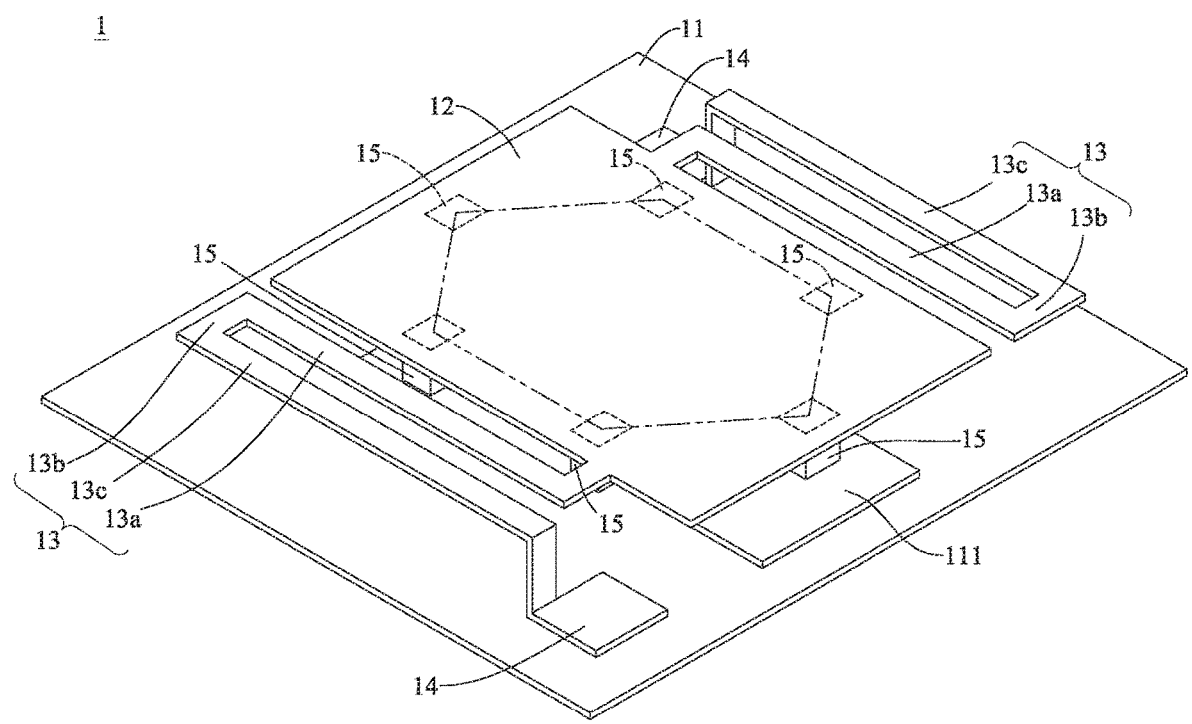
FIG. 8 is a perspective view of a microelectromechanical infrared sensing apparatus in accordance with one embodiment of the disclosure.

Please refer to FIG. 8, which is a perspective view of a microelectromechanical infrared sensing apparatus 1 in accordance with one embodiment of the disclosure. As shown in FIG. 8, the stoppers 15 of the embodiment are disposed on the sensing plate 12 and the line segments connecting each of the two adjacent the stoppers 15 can form a hexagon.

Figure 9:
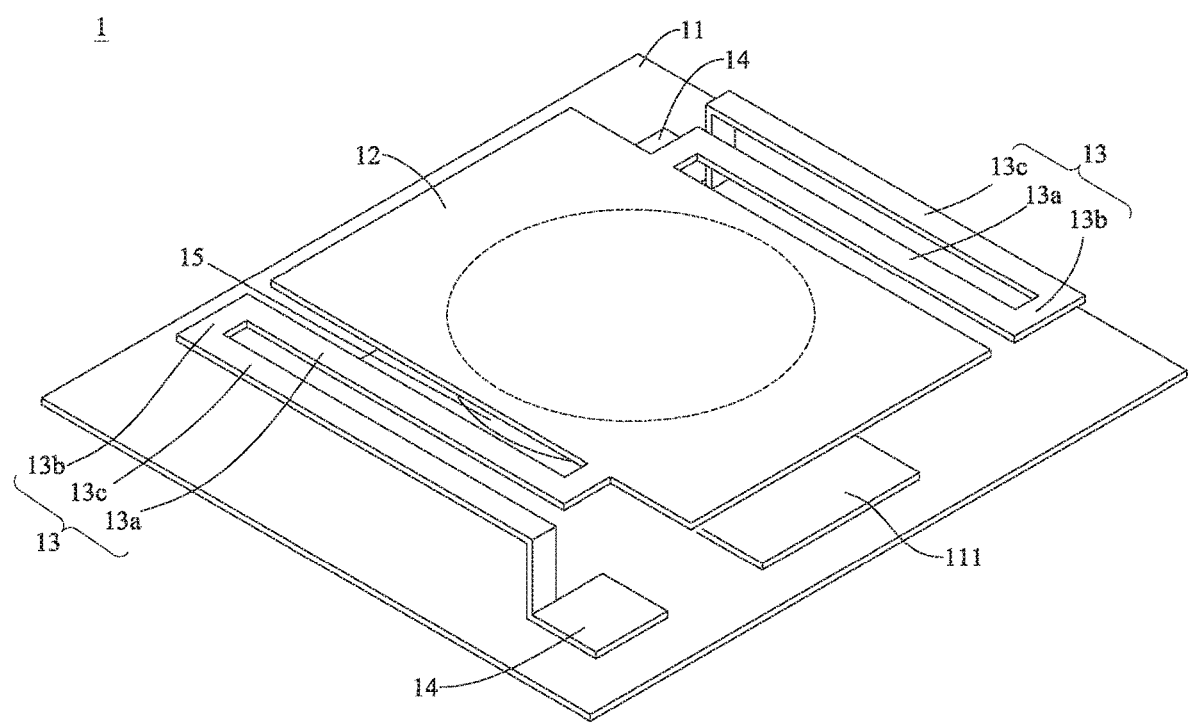
FIG. 9 is a perspective view of a microelectromechanical infrared sensing apparatus in accordance with one embodiment of the disclosure.

Please refer to FIG. 9, which is a perspective view of a microelectromechanical infrared sensing apparatus 1 in accordance with one embodiment of the disclosure. As shown in FIG. 9, the microelectromechanical infrared sensing apparatus 1 of the embodiment has one stopper 15, and the stopper 15 may be, but not limited to, a circular ring. In another embodiment, the stopper 15 may be a rectangular ring or a ring in a different shape.

Figure 10:
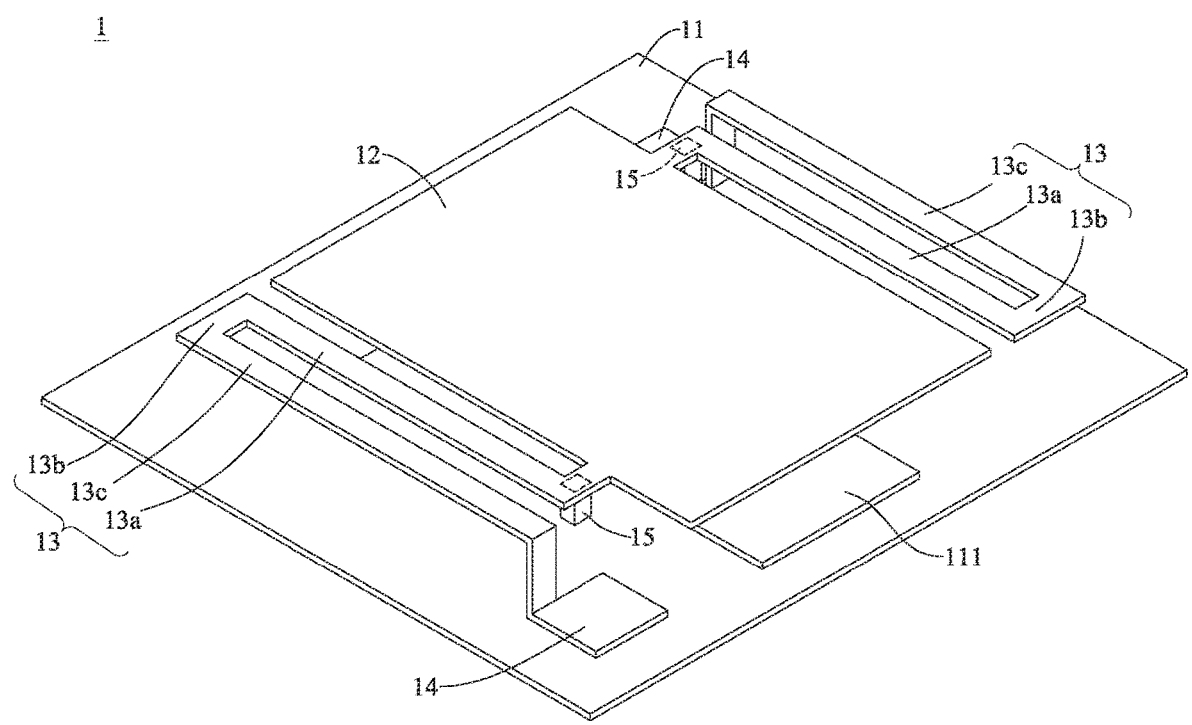
FIG. 10 is a perspective view of a microelectromechanical infrared sensing apparatus in accordance with one embodiment of the disclosure.

Please refer to FIG. 10, which is a perspective view of a microelectromechanical infrared sensing apparatus 1 in accordance with one embodiment of the disclosure. As shown in FIG. 10, the microelectromechanical infrared sensing apparatus 1 of the embodiment has two stoppers 15 disposed at the connection portions 13a of the supporting elements 13 respectively. Each stopper 15 is disposed at one end, close to the sensing plate 12, of the connection portion 13a of the corresponding supporting element 13. The microelectromechanical infrared sensing apparatus 1 operates in the first absorbing rate mode before the controller 17 turns on the voltage source 16. When the voltage source 16 is turned on by the controller 17 to generate the first control voltage V1 for establishing a voltage difference between the sensing plate 12 and the infrared reflecting layer 111, the voltage difference would induce the sensing plate 12 to move toward the infrared reflecting layer 111. Then, the downward movement of the sensing plate 12 would be stopped while the stoppers 15 disposed on the connecting portions 13a of the supporting elements 13 contact the substrate 11. At the moment, the microelectromechanical infrared sensing apparatus 1 is operated in the second absorbing rate mode.

Figure 11:
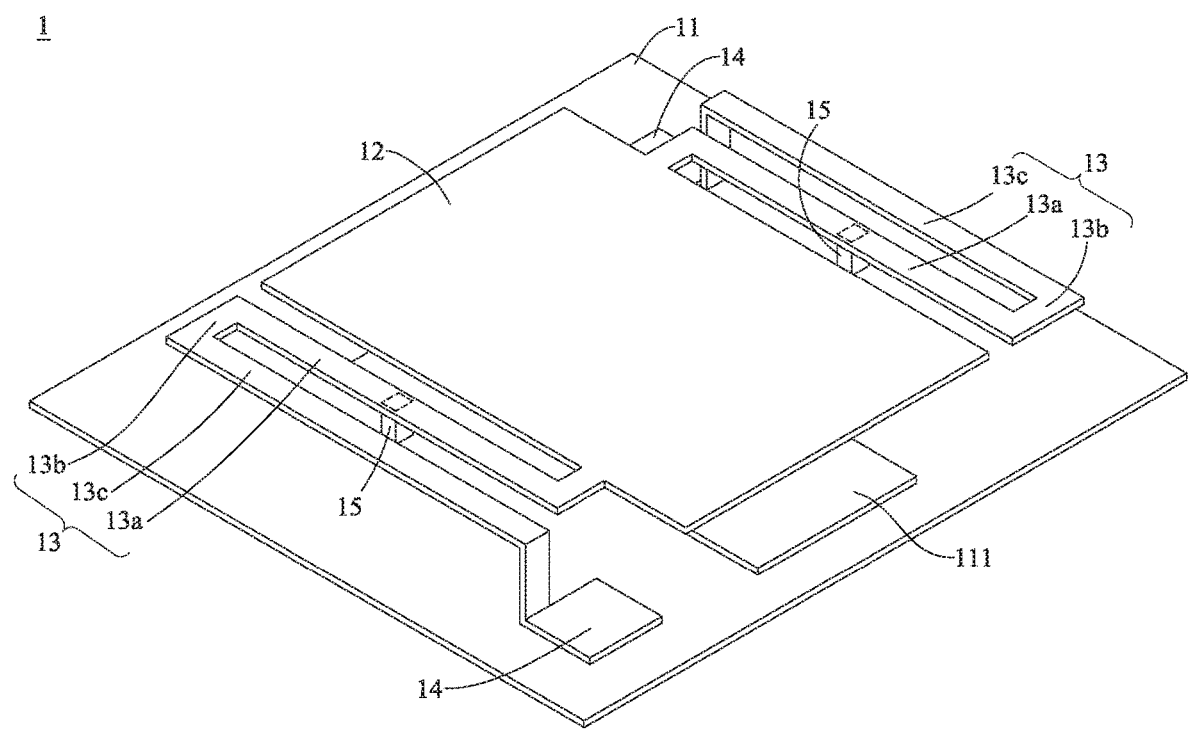
FIG. 11 is a perspective view of a microelectromechanical infrared sensing apparatus in accordance with one embodiment of the disclosure.

Please refer to FIG. 11, which is a perspective view of a microelectromechanical infrared sensing apparatus 1 in accordance with one embodiment of the disclosure. As shown in FIG. 11, the two stoppers 15 of the embodiment are disposed at the corresponding central portions of the respective connecting portions 13a of the individual supporting elements 13. While the controller 17 doesn't turn on the voltage source 16, the microelectromechanical infrared sensing apparatus 1 is operated in the first absorbing rate mode. When the voltage source 16 is turned on by the controller 17 to generate the first control voltage V1 for establishing a voltage difference between the sensing plate 12 and the infrared reflecting layer 111, this voltage difference would induce the sensing plate 12 to move toward the infrared reflecting layer 111. Then, the downward movement of the sensing plate 12 would be stopped while the stoppers 15 disposed on the central portion of the connecting portions 13a of the supporting elements 13 contact the substrate 11. At the moment, the microelectromechanical infrared sensing apparatus 1 is operated in the second absorbing rate mode.

Figure 12:
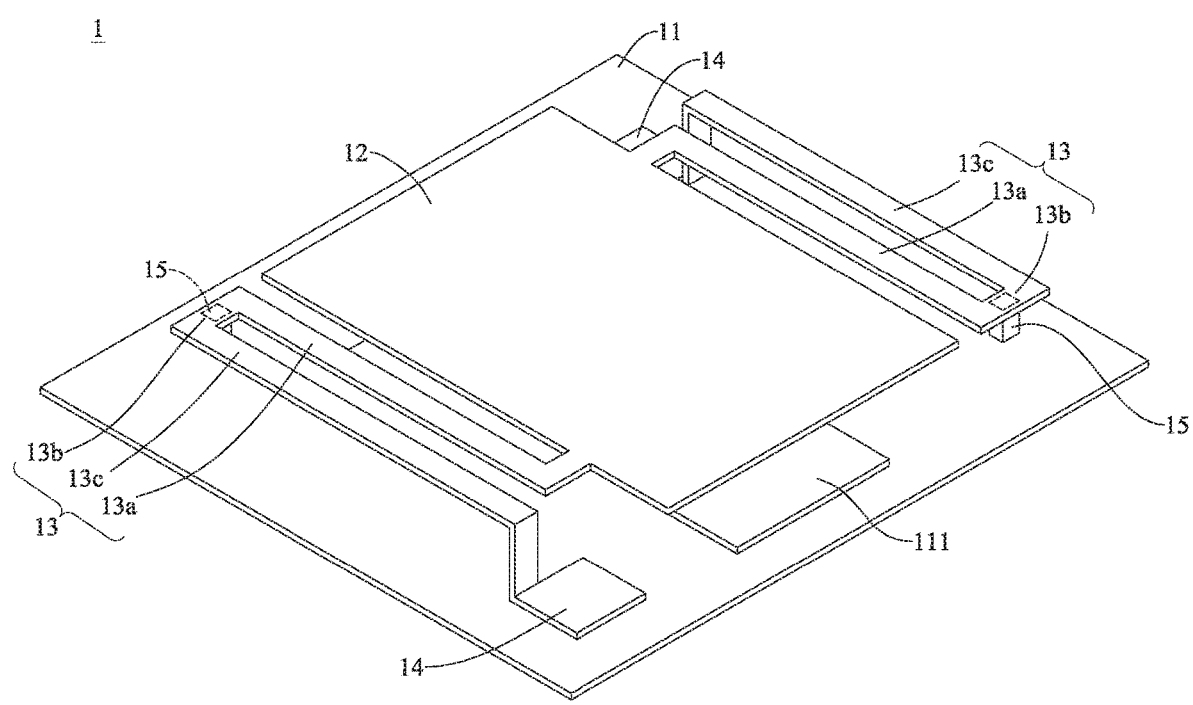
FIG. 12 is a perspective view of a microelectromechanical infrared sensing apparatus in accordance with one embodiment of the disclosure.

Please refer to FIG. 12, which is a perspective view of a microelectromechanical infrared sensing apparatus 1 in accordance with one embodiment of the disclosure. As shown in FIG. 12, the two stoppers 15 of the embodiment are disposed at the corresponding bending portions 13b of the respective supporting elements 13. When the controller 17 does not turn on the voltage source 16, the microelectromechanical infrared sensing apparatus 1 is operated in the first absorbing rate mode. On the other hand, if the voltage source 16 is turned on by the controller 17 to generate the first control voltage V1 for establishing a voltage difference between the sensing plate 12 and the infrared reflecting layer 111, this voltage difference would induce the sensing plate 12 to move toward the infrared reflecting layer 111. Then, the sensing plate 12 stops moving while the stoppers 15 disposed on the bending portions 13b of the supporting elements 13 contact the substrate 11. At the moment, the microelectromechanical infrared sensing apparatus 1 is operated in the second absorbing rate mode.

Figure 13:
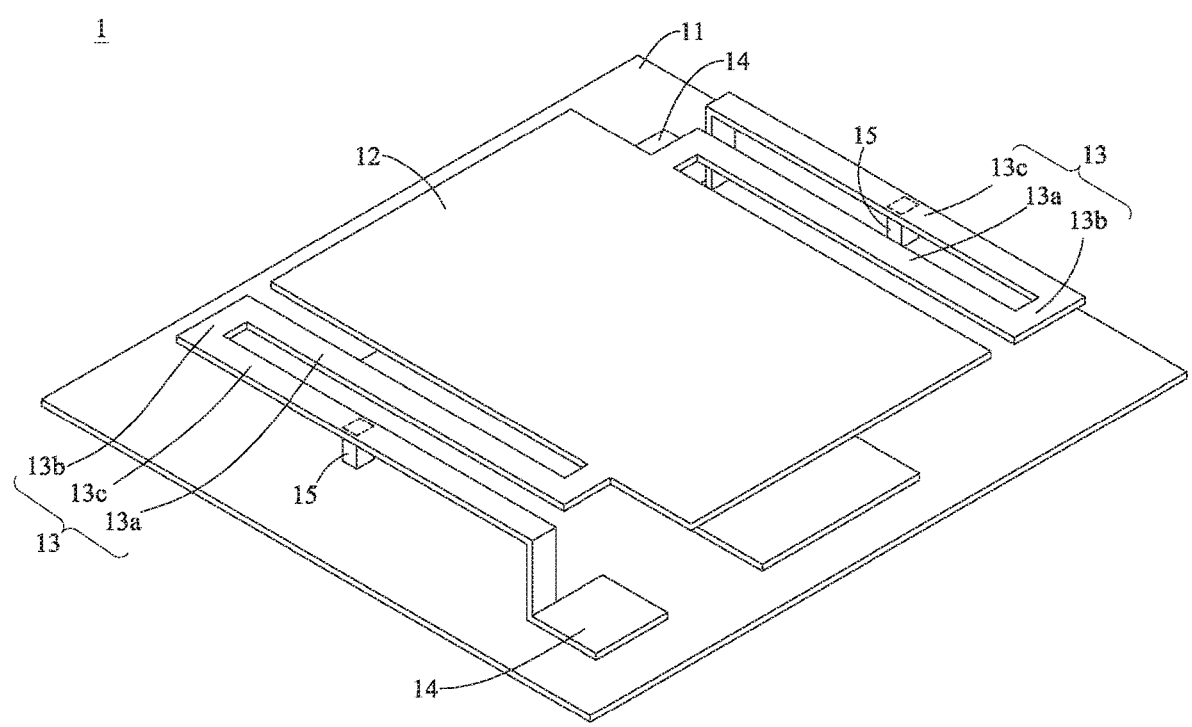
FIG. 13 is a perspective view of a microelectromechanical infrared sensing apparatus in accordance with one embodiment of the disclosure.

Please refer to FIG. 13, which is a perspective view of a microelectromechanical infrared sensing apparatus 1 in accordance with one embodiment of the disclosure. As shown in FIG. 13, the two stoppers 15 of the embodiment are disposed at the corresponding central portion of the respective supporting portions 13c of the individual supporting elements 13. When the controller 17 does not turn on the voltage source 16, the microelectromechanical infrared sensing apparatus 1 is operated in the first absorbing rate mode. On the other hand, if the voltage source 16 is turned on by the controller 17 to generate the first control voltage V1 for establishing a voltage difference between the sensing plate 12 and the infrared reflecting layer 111, this voltage difference would induce the sensing plate 12 to move toward the infrared reflecting layer 111. Then, the sensing plate 12 stops moving downward as soon as the stoppers 15 disposed on the central portion of the supporting portions 13c of the supporting elements 13 contact the substrate 11. At the moment, the microelectromechanical infrared sensing apparatus 1 is operated in the second absorbing rate mode.

It shall be understood that each of the aforesaid embodiments just exemplifies the disclosure and is not intended to limit the scope of the disclosure. The quantity of the stoppers 15 of the microelectromechanical infrared sensing apparatus 1, the structures of all elements and the cooperation relations thereof can be modified according to actual requirements.

It is worthy to point out that if the temperature of the sensing target is high (i.e., the energy of the infrared light radiated by the sensing target is high), the high-resolution readout circuit would tend to be saturated when the sensing signals of the conventional microelectromechanical infrared sensing apparatus is read out. The above situation causes the microelectromechanical infrared sensing apparatus unable to sense the sensing target of high temperature anymore, so the sensing range of the conventional microelectromechanical infrared sensing apparatus is limited. However, according to one embodiment of the disclosure, the instant microelectromechanical infrared sensing apparatus 1 includes the stoppers 15, and the distance between the sensing plate 12 and the infrared reflecting layer 111 thereof can be adjusted via the voltage source 16 and the stoppers 15. Therefore, the microelectromechanical infrared sensing apparatus 1 can be applicable to an environment with different temperatures, and can effectively prevent the readout circuit from being saturated. Hence, the sensing range of the microelectromechanical infrared sensing apparatus 1 can be significantly expanded.

Besides, the infrared absorbing layer of the conventional microelectromechanical infrared sensing apparatus tends to suffer from high stress and large warpage during the manufacturing process. These critical situations cause inconsistent spacing between the infrared absorbing layer and the infrared reflecting layer, from which the sensing performance of the microelectromechanical infrared sensing apparatus would be significantly affected. Thus, the conventional microelectromechanical infrared sensing apparatus needs a complicated manufacturing process to adjust the thickness of the infrared absorbing layer for optimizing the stress and the warpage. On the other hand, the sensing plate 12 of the instant microelectromechanical infrared sensing apparatus 1 is symmetrically structured, and so the sensing plate 12 will not be easily warped due to temperature variation during the manufacturing process or in the any environment. Accordingly, the distance between the sensing plate 12 and the infrared inflecting layer 111 can be precisely controlled, such that the sensing performance of the microelectromechanical infrared sensing apparatus 1 can be optimized. More specifically, the infrared sensing layer 121 and the conducting layer 123 of the sensing plate 12 are made of the same material, have the same thickness, and are symmetrically disposed on the two opposing sides of the infrared absorbing layer 122, respectively. Thus, it is not required anymore to conduct excessive experiments for obtaining an optimal thickness for the infrared absorbing layer 122. Accordingly, the complexity of the manufacturing process and the cost for manufacturing the microelectromechanical infrared sensing apparatus 1 can be considerably reduced.

Moreover, according to one embodiment of the disclosure, the sensing plate 12 of the microelectromechanical infrared sensing apparatus 1 has a symmetrical structure (i.e., the infrared sensing layer 121 and the conducting layer 123 of the sensing plate 12 are made of the same material, have the same thickness, and are symmetrically disposed on the two opposing sides of the infrared absorbing layer 122, respectively). Thus, the sensing plate 12 does not tend to suffer from high stress and large warpage caused by the environmental temperature variation. Accordingly, the distance between the sensing plate 12 and the infrared inflecting layer 111 can be accurately adjusted and precisely controlled, so the microelectromechanical infrared sensing apparatus 1 can be operated correctly and effectively.

Figure 14:
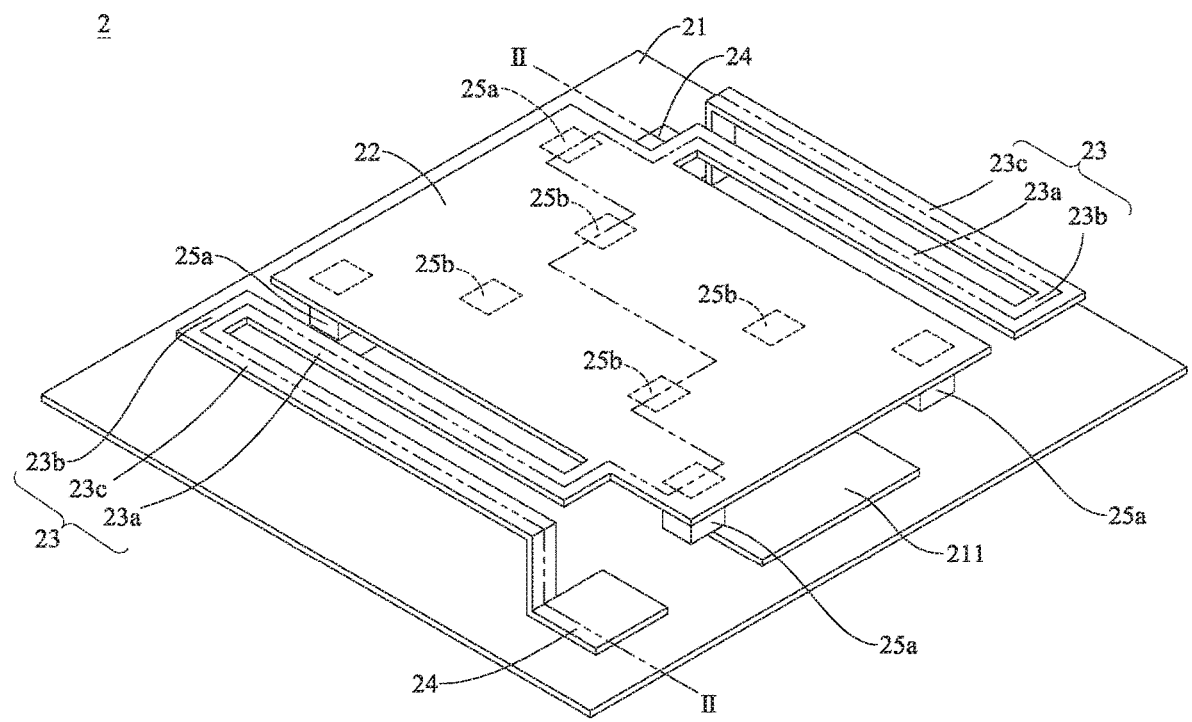
FIG. 14 is a perspective view of a microelectromechanical infrared sensing apparatus in accordance with one embodiment of the disclosure.
Figure 15:
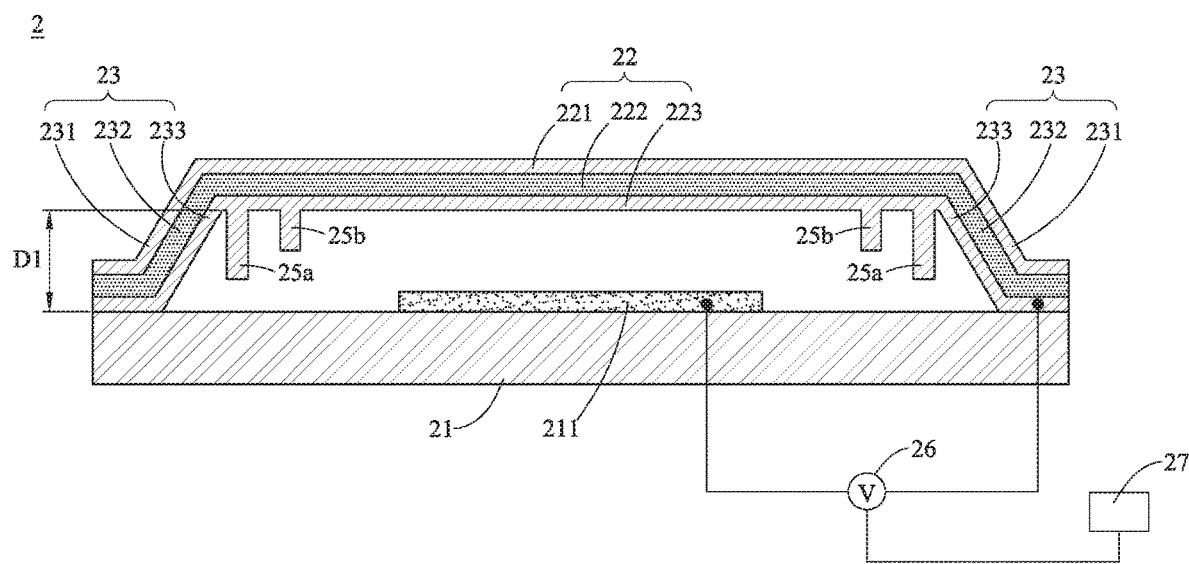
FIG. 15~FIG. 17 are cross-sectional views of the microelectromechanical infrared sensing apparatus in accordance with one embodiment of the disclosure.

Please refer to FIG. 14, FIG. 15, FIG. 16 and FIG. 17, which are a perspective view and three associated cross-sectional views of the same microelectromechanical infrared sensing apparatus 2 in accordance with one embodiment of the disclosure respectively. FIG. 15 is the cross-sectional view of the microelectromechanical infrared sensing apparatus 2 along line II-II in FIG. 14. As shown in FIG. 14 and FIG. 15, the microelectromechanical infrared sensing apparatus 2 includes a substrate 21, a sensing plate 22, a plurality of supporting elements 23, a plurality of anchors 24, a plurality of stoppers 25a,25b, a voltage source 26 and a controller 27. The substrate 21 includes an infrared inflecting layer 211. The sensing plate 22 includes an infrared sensing layer 221, a conducting layer 223 and an infrared absorbing layer 222. Each of the supporting elements 23 includes a connecting portion 23a, a bending portion 23b and a supporting portion 23c.

The above elements are similar to the embodiments of FIG. 1~FIG. 13, so details thereabout would be omitted herein. The difference between this embodiment and the embodiments of FIG. 1~FIG. 13 is that the stoppers of the embodiment include a plurality of first stoppers 25a and a plurality of second stoppers 25b. The first stoppers 25a have the same height, and the second stoppers 25b have another same height. The distance between the first stoppers 25a and the center of the sensing plate 22 is greater than that between the second stoppers 25b and the center of the sensing plate 22. In other words, compared with the second stoppers 25b, the first stoppers 25a are located closer to the circumference of the sensing plate 22. Besides, in the embodiment, the height of the first stoppers 25a is greater than that of the second stoppers 25b. In another embodiment, the first stoppers 25a can also have different heights. Similarly, the second stoppers 25b can also have different heights.

The microelectromechanical infrared sensing apparatus 2 can have more operating points due to the aforesaid structuring. As shown in FIG. 15, when the target temperature is T1, the controller 27 does not turn on the voltage source 26, and the distance between the sensing plate 22 and the infrared inflecting layer 211 is D1. In this case, the microelectromechanical infrared sensing apparatus 2 is operated in a first absorbing rate mode (the mode of high absorbing rate).

Figure 16:
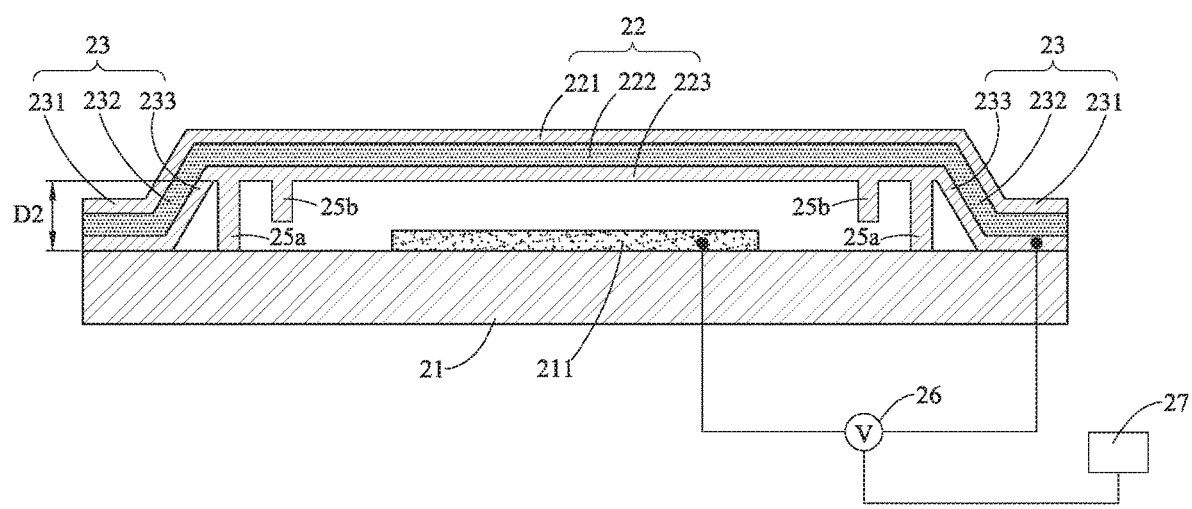

As shown in FIG. 16, when the target temperature is T2, greater than T1, the controller 27 can turn on the voltage source 26 to generate a first control voltage V1 for establishing a voltage difference between the sensing plate 22 and the infrared reflecting layer 211, so that the sensing plate 22 is induced to move toward the infrared reflecting layer 211. When the first stoppers 25a contact the substrate 21, the sensing plate 22 stops moving. At the moment, the distance between the sensing plate 22 and the infrared inflecting layer 211 is D2, which is substantially equal to the height of the first stoppers 25a. Thus, the second stoppers 25b do not contact the substrate 21, and so the microelectromechanical infrared sensing apparatus 2 operates in a second absorbing rate mode (the mode of medium absorbing rate).

Figure 17:
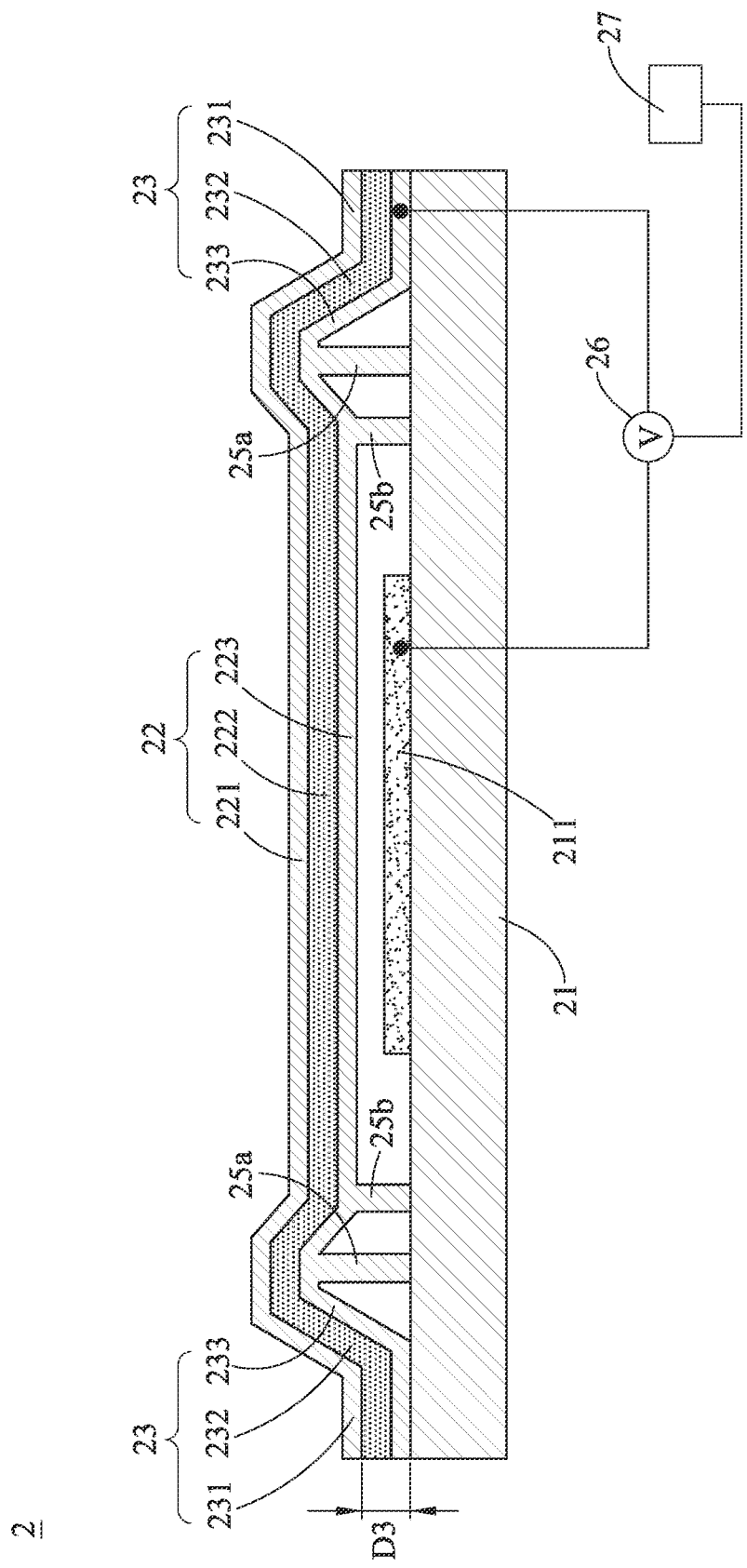

As shown in FIG. 17, when the target temperature is T3, greater than T2, the controller 27 would adjust the voltage source 26 to increase the voltage from the first control voltage V1 to a second control voltage V2. Then, the sensing plate 22 moves further toward the infrared reflecting layer 211. When the second stoppers 25b contact the substrate 21, the sensing plate 22 stops moving. At the moment, the distance between the sensing plate 22 and the infrared inflecting layer 211 is D3, which is substantially equal to the height of the second stoppers 25b. Accordingly, the microelectromechanical infrared sensing apparatus 2 is operated in a third absorbing rate mode (the mode of low absorbing rate). According to the operational process shown in FIG. 15~FIG. 17, the absorbing rate of the infrared sensing layer 221 (i.e., the ratio in percentage of infrared light absorbed by the infrared sensing layer 221) of the embodiment can be classified into three modes: the first absorbing rate mode (the mode of high absorbing rate), the second absorbing rate mode (the mode of medium absorbing rate) and the third absorbing rate mode (the mode of low absorbing rate). Accordingly, the microelectromechanical infrared sensing apparatus 2 of the embodiment can be operated in a stepping manner for providing more different absorbing rates for the users to sense different sensing targets having different temperatures/infrared radiations.

Similarly, when the target temperature is T1, the controller 27 can turn off the voltage source 26, so that the sensing plate 22 moves in the direction away from the infrared inflecting layer 211. Then, the sensing plate 22 returns to the initial position, as shown in FIG. 15. In this case, the distance between the sensing plate 22 and the infrared inflecting layer 211 returns to D1 again, and the microelectromechanical infrared sensing apparatus 2 is operated in the first absorbing rate mode.

The mechanism described above can change the absorbing rate of the infrared sensing layer 221 to prevent the readout circuit from being saturated. Thus, the microelectromechanical infrared sensing apparatus 2 can have three operating points, and so the sensing range of the microelectromechanical infrared sensing apparatus 2 can be effectively expanded. The microelectromechanical infrared sensing apparatus 2 can also have more stoppers with different heights, such that the microelectromechanical infrared sensing apparatus 2 can have more operating points to satisfy different measurement requirements. Moreover, the above microelectromechanical infrared sensing apparatus 2 can further be integrated with an algorithm for automatically selecting the most appropriate distance between the sensing plate 22 and the infrared inflecting layer 211 from these operating points according to the temperature of the sensing target. In this way, the infrared absorbing layer 222 can absorb most of the thermal energy, but the readout circuit would not be saturated.

It shall be understood that each of the aforesaid embodiments just exemplifies the disclosure and is not intended to limit the scope of the disclosure. The quantity of the first stoppers 25a and the second stoppers 25b of the microelectromechanical infrared sensing apparatus 2, the structures of all elements and the cooperation relations thereof can be modified according to actual requirements.

Figure 18:
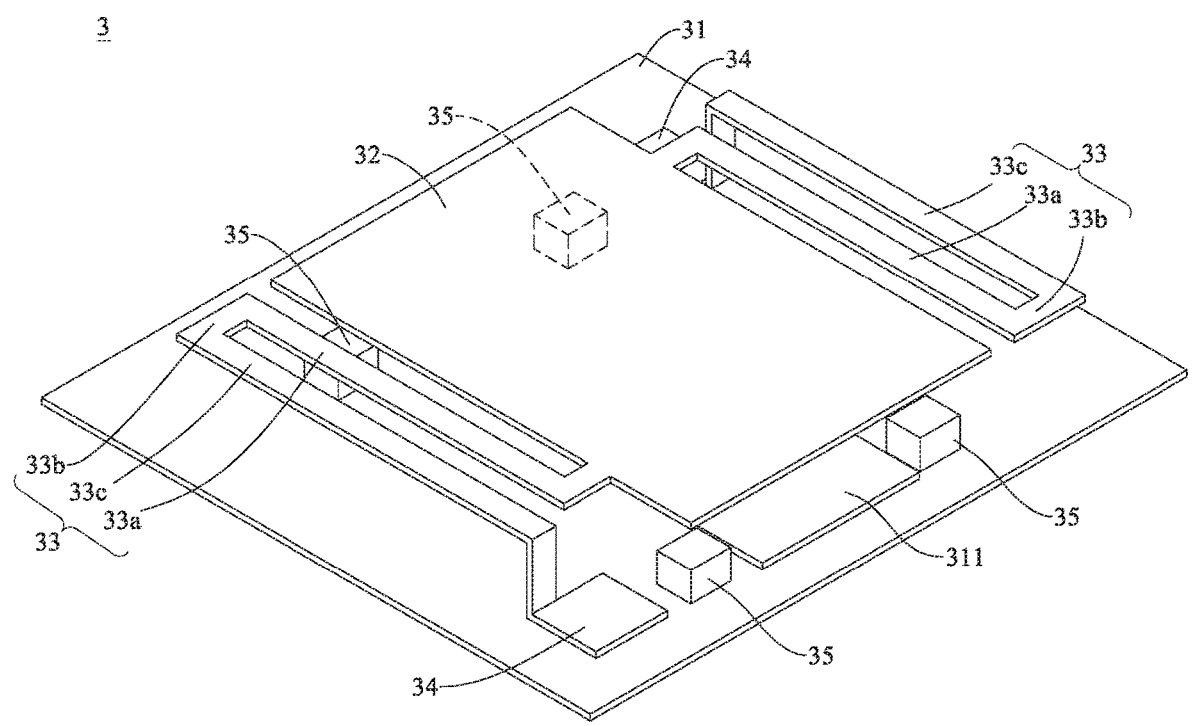
FIG. 18 is a perspective view of a microelectromechanical infrared sensing apparatus in accordance with one embodiment of the disclosure.
Figure 19:
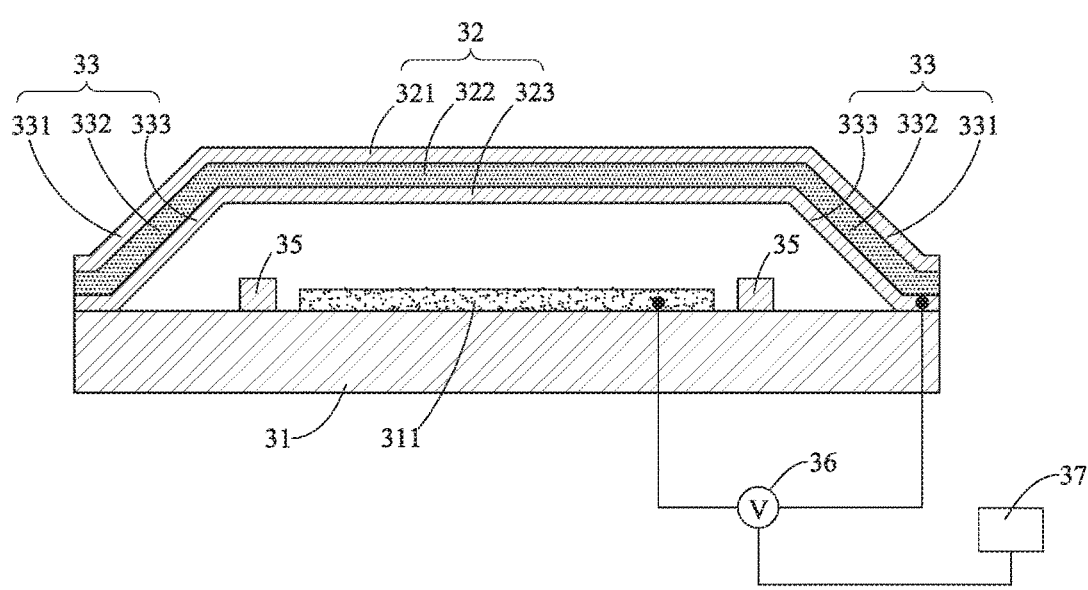
FIG. 19 and FIG. 20 are cross-sectional views of the microelectromechanical infrared sensing apparatus in accordance with one embodiment of the disclosure.
Figure 20:
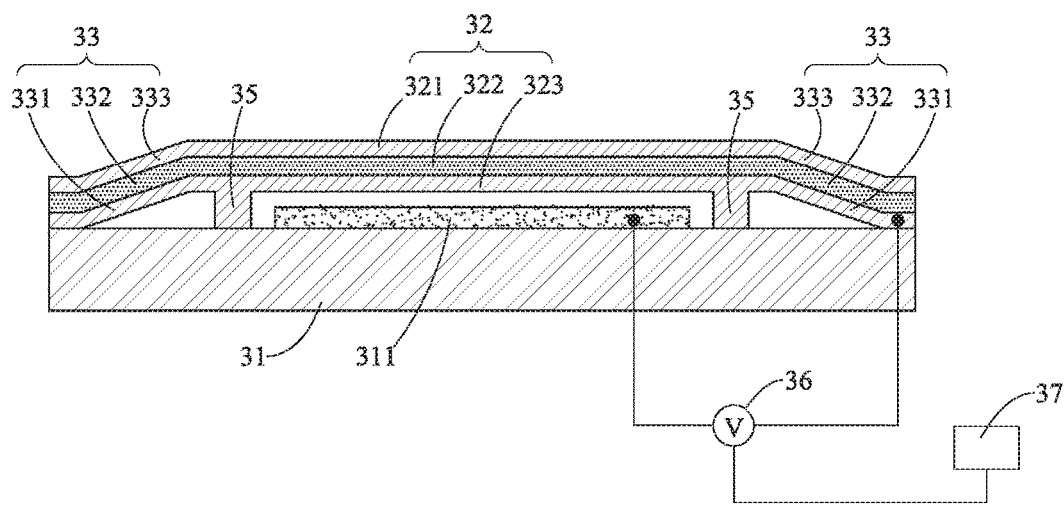

Please refer to FIG. 18, FIG. 19 and FIG. 20, which are a perspective view and two associated cross-sectional views of a microelectromechanical infrared sensing apparatus 3 in accordance with one embodiment of the disclosure respectively. As shown in FIG. 18 and FIG. 19, the microelectromechanical infrared sensing apparatus 3 includes a substrate 31, a sensing plate 32, a plurality of supporting elements 33, a plurality of anchors 34, a plurality of stoppers 35, a voltage source 36 and a controller 37. The substrate 31 includes an infrared inflecting layer 311. The sensing plate 32 includes an infrared sensing layer 321, a conducting layer 323 and an infrared absorbing layer 322. Each of the supporting elements 33 includes a connecting portion 33a, a bending portion 33b and a supporting portion 33c.

The above elements of the microelectromechanical infrared sensing apparatus 3 are similar to those of the embodiments of FIG. 1~FIG. 13, and so details thereabout would be omitted herein. As shown in FIG. 18, the difference between this embodiment and the embodiments of FIG. 1~FIG. 13 is that the stoppers 35 of this embodiment are disposed on the substrate 31. The above structure also allows the microelectromechanical infrared sensing apparatus 3 to achieve the technical effects similar to the embodiments of FIG. 1~FIG. 13. As shown in FIG. 19, when the target temperature is T1, the controller 37 does not turn on the voltage source 36. At the moment, the distance between the sensing plate 32 and the infrared reflecting layer 311 is D1, and the microelectromechanical infrared sensing apparatus 3 is operated in a first absorbing rate mode.

As shown in FIG. 20, when the target temperature is T2 greater than T1, the controller 37 can turn on the voltage source 36 to generate a first control voltage V1 for establishing a voltage difference between the sensing plate 32 and the infrared reflecting layer 311, so that the sensing plate 32 is induced to move toward the infrared reflecting layer 311. When the stoppers 35 and the sensing plate 32 contact with each other, the sensing plate 32 stops moving. At the moment, the distance between the sensing plate 32 and the infrared inflecting layer 311 is D2, which is substantially equal to the height of the stoppers 35. In this case, the microelectromechanical infrared sensing apparatus 3 is operated in a second absorbing rate mode to prevent the readout circuit from being saturated. Accordingly, the sensing range of the microelectromechanical infrared sensing apparatus 3 can be effectively expanded.

When the target temperature is T1, the controller 37 can turn off the voltage source 36, so that the sensing plate 32 moves in the direction away from the infrared inflecting layer 311 and then returns to the initial position, as shown in FIG. 19. At the moment, the distance between the sensing plate 32 and the infrared inflecting layer 311 returns to D1 again, and the microelectromechanical infrared sensing apparatus 3 is operated in the first absorbing rate mode.

It shall be understood that each of the aforesaid embodiments just exemplifies the disclosure and is not intended to limit the scope of the disclosure. The quantity, the shape and the arrangement of the stoppers 35 of the microelectromechanical infrared sensing apparatus 3 can be modified according to actual requirements.

In summation of the description above, according to one embodiment of the disclosure, the microelectromechanical infrared sensing apparatus 1 includes one or more stoppers 15. In addition, the distance between the sensing plate 12 and the infrared reflecting layer 111 of the microelectromechanical infrared sensing apparatus 1 can be adjusted. Thus, the microelectromechanical infrared sensing apparatus 1 can not only be applicable to different environmental temperatures, but also can effectively prevent the readout circuit from being saturated. Accordingly, the sensing range of the microelectromechanical infrared sensing apparatus 1 can be significantly expanded.

Besides, according to one embodiment of the disclosure, the microelectromechanical infrared sensing apparatus 2 includes several stoppers having different heights (the first stoppers 25a and the second stoppers 25b). Therefore, the microelectromechanical infrared sensing apparatus 2 can be adjusted, and so the microelectromechanical infrared sensing apparatus 2 can have several operating points. Hence, the sensing range of the microelectromechanical infrared sensing apparatus 2 can be further expanded.

Moreover, according to one embodiment of the disclosure, the sensing plate 12 of the microelectromechanical infrared sensing apparatus 1 has a symmetrical structure, so the sensing plate 12 suffers from low stress and the warpage on the sensing plate 12 can be reduced when the environmental temperature is changed. Accordingly, the distance between the sensing plate 12 and the infrared inflecting layer 111 can be precisely controlled, such that the sensing performance of the microelectromechanical infrared sensing apparatus 1 can be optimized.

Furthermore, according to one embodiment of the disclosure, the sensing plate 12 of the microelectromechanical infrared sensing apparatus 1 has a symmetrical structure, which can not only reduce stress and warpage of the sensing plate 12, but also can reduce the complexity of the manufacturing process. Therefore, the manufacturing cost of the microelectromechanical infrared sensing apparatus 1 can be effectively reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A microelectromechanical infrared sensing apparatus, comprising:
   a substrate, comprising an infrared reflecting layer;
   a sensing plate, comprising an infrared absorbing layer;
   a plurality of supporting elements, disposed on the substrate, wherein each of the supporting elements is connected to the sensing plate, such that the sensing plate is suspended above the infrared reflecting layer; and,
   a plurality of stoppers, disposed between the substrate and the sensing plate, wherein the stoppers connect either one of the substrate and the sensing plate;
   wherein, when the sensing plate moves toward the infrared reflecting layer and stops moving when the stoppers contact the other one of the substrate and the sensing plate, a distance between the sensing plate and the infrared reflecting layer is substantially equal to a height of at least one of the stoppers.

2. The microelectromechanical infrared sensing apparatus of claim 1, wherein a stiffness of the supporting elements in a direction of a normal vector of the substrate is less than a stiffness of the sensing plate in the direction of the normal vector of the substrate.

3. The microelectromechanical infrared sensing apparatus of claim 1, wherein the stoppers are disposed on the sensing plate.

4. The microelectromechanical infrared sensing apparatus of claim 3, wherein line segments connecting each of the two adjacent the stoppers form a polygon, and the polygon is axial-symmetrical or central-symmetrical.

5. The microelectromechanical infrared sensing apparatus of claim 1, wherein the stoppers are disposed on the supporting elements.

6. The microelectromechanical infrared sensing apparatus of claim 1, wherein the stoppers are disposed on the substrate.

7. The microelectromechanical infrared sensing apparatus of claim 1, further comprising a voltage source electrically connected to the infrared reflecting layer and the sensing plate so as to establish a voltage difference between the infrared reflecting layer and the sensing plate.

8. The microelectromechanical infrared sensing apparatus of claim 1, wherein the stoppers have different heights.

9. The microelectromechanical infrared sensing apparatus of claim 8, wherein the stoppers comprises a plurality of first stoppers connected to at least one of the supporting elements and a plurality of second stoppers connected to the sensing plate.

10. The microelectromechanical infrared sensing apparatus of claim 9, wherein the first stoppers have different heights.

11. The microelectromechanical infrared sensing apparatus of claim 9, wherein the second stoppers have different heights.

12. The microelectromechanical infrared sensing apparatus of claim 9, wherein a height of at least one of the first stoppers are greater than a height of at least one of the second stoppers.

13. The microelectromechanical infrared sensing apparatus of claim 12, wherein a distance between the first stoppers and a center of the sensing plate is greater than a distance between the second stoppers and the center of the sensing plate.

14. The microelectromechanical infrared sensing apparatus of claim 8, wherein the sensing plate further comprises an infrared sensing layer and a conducting layer, and the infrared absorbing layer of the sensing plate is disposed between the infrared sensing layer and the conducting layer.

15. The microelectromechanical infrared sensing apparatus of claim 14, further comprising a voltage source electrically connected to the infrared reflecting layer and the conducting layer so as to establish a voltage difference between the infrared reflecting layer and the conducting layer.

16. The microelectromechanical infrared sensing apparatus of claim 14, wherein the conducting layer and the infrared sensing layer of the sensing plate are made of the same material.

17. The microelectromechanical infrared sensing apparatus of claim 16, wherein the conducting layer and the infrared sensing layer of the sensing plate are selected from a group consisting of an alloy layer, a metal compound layer, a metal-oxide layer, a silicon compound layer and a silicon layer, and the infrared absorbing layer of the sensing plate is a dielectric material layer.

18. The microelectromechanical infrared sensing apparatus of claim 17, wherein a material of the conducting layer of the sensing plate and a material of the infrared sensing layer of the sensing plate are selected from a group consisting of SiGe, $VO_x$, p-Si, a-Si and Ti-silicide, and a material of the infrared absorbing layer of the sensing plate is selected from a group consisting of $SiN_x$, $SiO_x$ and $SiO_xN_y$.

19. The microelectromechanical infrared sensing apparatus of claim 16, wherein a thickness of the conducting layer of the sensing plate is substantially equal to a thickness of the infrared sensing layer of the sensing plate.

20. The microelectromechanical infrared sensing apparatus of claim 14, wherein each of the supporting elements further comprises an infrared absorbing layer, an infrared sensing layer and a conducting layer, and the infrared absorbing layer of each of the supporting elements is disposed between the infrared sensing layer of each of the supporting elements and the conducting layer of each of the supporting elements.

21. The microelectromechanical infrared sensing apparatus of claim 20, wherein the infrared absorbing layer of each of the supporting elements is connected to the infrared absorbing layer of the sensing plate, the infrared sensing layer of each of the supporting elements is connected to the infrared sensing layer of the sensing plate, and the conducting layer of each of the supporting elements is connected to the conducting layer of the sensing plate.

22. The microelectromechanical infrared sensing apparatus of claim 21, wherein the conducting layer and the infrared sensing layer of each of the supporting elements are made of the same material.

23. The microelectromechanical infrared sensing apparatus of claim 22, wherein a thickness of the conducting layer of each of the supporting elements is substantially equal to a thickness of the infrared sensing layer of each of the supporting elements.

24. A microelectromechanical infrared sensing apparatus, comprising:
   a substrate, comprising an infrared reflecting layer;
   a sensing plate, comprising:
      an infrared sensing layer;
      a conducting layer; and
      an infrared absorbing layer, disposed between the infrared sensing layer of the sensing plate and the conducting layer of the sensing plate;
   a plurality of supporting elements, disposed on the substrate, wherein each of the supporting elements is connected to the sensing plate, such that the sensing plate is suspended above the infrared reflecting layer; and
   a plurality of stoppers, disposed between the substrate and the sensing plate, wherein the stoppers connects either one of the substrate and the sensing plate;
wherein, when the sensing plate moves toward the infrared reflecting layer and stops moving when the stoppers contact the other one of the substrate and the sensing plate, a distance between the sensing plate and the infrared reflecting layer is substantially equal to a height of at least one of the stoppers.

25. The microelectromechanical infrared sensing apparatus of claim 24, further comprising a voltage source electrically connected to the infrared reflecting layer and the conducting layer of the sensing plate so as to establish a voltage difference between the infrared reflecting layer and the conducting layer of the sensing plate.

26. The microelectromechanical infrared sensing apparatus of claim 24, wherein the conducting layer and the infrared sensing layer of the sensing plate are made of the same material.

27. The microelectromechanical infrared sensing apparatus of claim 26, wherein the conducting layer and the infrared sensing layer of the sensing plate are made of a material selected from a group consisting of SiGe, $VO_x$, p-Si, a-Si and Ti-silicide, and a material of the infrared absorbing layer of the sensing plate is selected from a group consisting of $SiN_x$, $SiO_x$ and $SiO_xN_y$.

28. The microelectromechanical infrared sensing apparatus of claim 26, wherein a thickness of the conducting layer of the sensing plate is substantially equal to a thickness of the infrared sensing layer of the sensing plate.

29. The microelectromechanical infrared sensing apparatus of claim 24, wherein each of the supporting elements further comprises an infrared absorbing layer, an infrared sensing layer and a conducting layer, and the infrared absorbing layer of each of the supporting elements is disposed between the infrared sensing layer of the supporting element and the conducting layer of the supporting element.

30. The microelectromechanical infrared sensing apparatus of claim 29, wherein the infrared absorbing layer of each of the supporting elements is connected to the infrared absorbing layer of the sensing plate, the infrared sensing layer of each of the supporting elements is connected to the infrared sensing layer of the sensing plate, and the conducting layer of each of the supporting elements is connected to the conducting layer of the sensing plate.

31. The microelectromechanical infrared sensing apparatus of claim 30, wherein the conducting layer and the infrared sensing layer of each of the supporting elements are made of the same material.

32. The microelectromechanical infrared sensing apparatus of claim 31, wherein a thickness of the conducting layer of each of the supporting elements is substantially equal to a thickness of the infrared sensing layer of each of the supporting elements.

* * * * *